United States Patent [19]
Volz et al.

[11] Patent Number: 5,949,358
[45] Date of Patent: Sep. 7, 1999

[54] RATE N(N+1) CODE FOR EMBEDDED SERVO ADDRESS ENCODING

[75] Inventors: Leroy Allen Volz, Northridge; Chandra Chuda Varanasi, Simi Valley; Dennis Carl Stone, Glendale, all of Calif.

[73] Assignee: Seagate Technology, Inc., Scotts Valley, Calif.

[21] Appl. No.: 08/448,594

[22] PCT Filed: Jun. 7, 1995

[86] PCT No.: PCT/US95/06255

§ 371 Date: Jul. 14, 1995

§ 102(e) Date: Jul. 14, 1995

[87] PCT Pub. No.: WO96/41342

PCT Pub. Date: Dec. 19, 1996

[51] Int. Cl.$^6$ .................................................. H03M 7/20
[52] U.S. Cl. ........................................................ 341/102
[58] Field of Search .................................. 341/102, 103, 341/97, 59; 360/49, 40

[56] References Cited

U.S. PATENT DOCUMENTS

| | | | |
|---|---|---|---|
| 5,270,878 | 12/1993 | Kaida et al. | 360/49 |
| 5,274,510 | 12/1993 | Sugita et al. | 360/49 |
| 5,737,142 | 4/1998 | Zook | 360/49 |

FOREIGN PATENT DOCUMENTS

| | | |
|---|---|---|
| 0 517 230 A2 | 6/1992 | European Pat. Off. . |
| 39 23 165 A1 | 7/1989 | Germany . |

OTHER PUBLICATIONS

*IBM Technical Disclosure Bulletin*, Jul. 1982, vol. 25, No. 2, pp. 776–777.

*Primary Examiner*—Brian Young
*Attorney, Agent, or Firm*—Kinney & Lange, P.A.

[57] ABSTRACT

A track address pattern embedded in the servo zones of a storage medium for representing a track address identification having a binary bit length "n". The track addresses pattern embedded in the medium is recoded from a Gray-code representation of the track address identification and has a code rate of n/(n+1), where n≧2. The recoded track address pattern (or codeword) is modeled from a Gray-code representation wherein a plurality of bit cells corresponding to a track address of the data storage apparatus are recoded to include a parity bit selected to maintain a selected parity for the track address pattern. More particularly, when a "1" occurs in the same bit cell location in two adjacent track address patterns, then the parity on "1"s up until the same bit cell location is the same for both of the $m^{th}$ and the $(m-1)^{th}$ track address patterns and for the $m^{th}$ and the $(m+1)^{th}$ track address patterns. Furthermore, the codewords provide that the bit cells of an $m^{th}$ track address differ from the bit cells of an $(m-1)^{th}$ track address in exactly two bit cell locations, and that the bit cells of an $m^{th}$ track address differ from the bit cells of an $(m+1)^{th}$ track address in exactly two bit cell locations. One of the positions in which the neighboring codewords differ is the parity bit position.

20 Claims, 7 Drawing Sheets

| Track Number | Gray Code Pattern | | | Encoded Address Pattern | | | |
|---|---|---|---|---|---|---|---|
| | $b_1$ | $b_2$ | $b_3$ | $b_2$ | Parity Bit(X) | $b_3$ | $b_1$ |
| 1 | 0 | 0 | 0 | 0 | 1 | 0 | 0 |
| 2 | 0 | 0 | 1 | 0 | 0 | 1 | 0 |
| 3 | 0 | 1 | 1 | 1 | 1 | 1 | 0 |
| 4 | 0 | 1 | 0 | 1 | 0 | 0 | 0 |
| 5 | 1 | 1 | 0 | 1 | 1 | 0 | 1 |
| 6 | 1 | 1 | 1 | 1 | 0 | 1 | 1 |
| 7 | 1 | 0 | 1 | 0 | 1 | 1 | 1 |
| 8 | 1 | 0 | 0 | 0 | 0 | 0 | 1 |

| Track Number | Gray Code Pattern | | |
|---|---|---|---|
| | $b_1$ | $b_2$ | $b_3$ |
| 1 | 0 | 0 | 0 |
| 2 | 0 | 0 | 1 |
| 3 | 0 | 1 | 1 |
| 4 | 0 | 1 | 0 |
| 5 | 1 | 1 | 0 |
| 6 | 1 | 1 | 1 |
| 7 | 1 | 0 | 1 |
| 8 | 1 | 0 | 0 |

FIGURE 1

| Track Number | Gray Code Pattern | Magnetization Orientation | | |
|---|---|---|---|---|
| | | $b_1$ | $b_2$ | $b_3$ |
| 1 | 000 | ----------> | ----------> | ----------> |
| 2 | 001 | ----------> | ----------> | <---------- |
| 3 | 011 | ----------> | <---------- | ----------> |
| 4 | 010 | ----------> | <---------- | <---------- |
| 5 | 110 | <---------- | ----------> | ----------> |
| 6 | 111 | <---------- | ----------> | <---------- |
| 7 | 101 | <---------- | <---------- | ----------> |
| 8 | 100 | <---------- | <---------- | <---------- |

FIGURE 2

| Track | Gray Code | $b_1$ | $b_2$ | $b_3$ |
|---|---|---|---|---|
| 1 | 000 | ------ | ------ | ------ |
| 2 | 001 | ------ | ------ | ↑ |
| 3 | 011 | ------ | ↑ | ↓ |
| 4 | 010 | ------ | ↑ | ------ |
| 5 | 110 | ↑ | ↓ | ------ |
| 6 | 111 | ↑ | ↓ | ↑ |
| 7 | 101 | ↑ | ------ | ↓ |
| 8 | 100 | ↑ | ------ | ------ |

FIGURE 3

| Track Number | Gray Code Pattern | | | Encoded Address Pattern | | | |
|---|---|---|---|---|---|---|---|
| | $b_1$ | $b_2$ | $b_3$ | $b_2$ | Parity Bit(X) | $b_3$ | $b_1$ |
| 1 | 0 | 0 | 0 | 0 | 1 | 0 | 0 |
| 2 | 0 | 0 | 1 | 0 | 0 | 1 | 0 |
| 3 | 0 | 1 | 1 | 1 | 1 | 1 | 0 |
| 4 | 0 | 1 | 0 | 1 | 0 | 0 | 0 |
| 5 | 1 | 1 | 0 | 1 | 1 | 0 | 1 |
| 6 | 1 | 1 | 1 | 1 | 0 | 1 | 1 |
| 7 | 1 | 0 | 1 | 0 | 1 | 1 | 1 |
| 8 | 1 | 0 | 0 | 0 | 0 | 0 | 1 |

FIGURE 4

| Track Number | Gray Code Pattern | | | | Encoded Address Pattern | | | | |
|---|---|---|---|---|---|---|---|---|---|
| | $b_1$ | $b_2$ | $b_3$ | $b_4$ | $b_1$ | $b_3$ | Parity Bit (X) | $b_4$ | $b_2$ |
| 1 | 0 | 0 | 0 | 0 | 0 | 0 | 1 | 0 | 0 |
| 2 | 0 | 0 | 0 | 1 | 0 | 0 | 0 | 1 | 0 |
| 3 | 0 | 0 | 1 | 1 | 0 | 1 | 1 | 1 | 0 |
| 4 | 0 | 0 | 1 | 0 | 0 | 1 | 0 | 0 | 0 |
| 5 | 0 | 1 | 1 | 0 | 0 | 1 | 1 | 0 | 1 |
| 6 | 0 | 1 | 1 | 1 | 0 | 1 | 0 | 1 | 1 |
| 7 | 0 | 1 | 0 | 1 | 0 | 0 | 1 | 1 | 1 |
| 8 | 0 | 1 | 0 | 0 | 0 | 0 | 0 | 0 | 1 |
| 9 | 1 | 1 | 0 | 0 | 1 | 0 | 1 | 0 | 1 |
| 10 | 1 | 1 | 0 | 1 | 1 | 0 | 0 | 1 | 1 |
| 11 | 1 | 1 | 1 | 1 | 1 | 1 | 1 | 1 | 1 |
| 12 | 1 | 1 | 1 | 0 | 1 | 1 | 0 | 0 | 1 |
| 13 | 1 | 0 | 1 | 0 | 1 | 1 | 1 | 0 | 0 |
| 14 | 1 | 0 | 1 | 1 | 1 | 1 | 0 | 1 | 0 |
| 15 | 1 | 0 | 0 | 1 | 1 | 0 | 1 | 1 | 0 |
| 16 | 1 | 0 | 0 | 0 | 1 | 0 | 0 | 0 | 0 |

FIGURE 5

| Track Number | Gray Code Pattern | | | Encoded Address Pattern | | | |
|---|---|---|---|---|---|---|---|
| | $b_1$ | $b_2$ | $b_3$ | $b_1$ | $b_3$ | Parity Bit(X) | $b_2$ |
| 1 | 0 | 0 | 0 | 0 | 0 | 1 | 0 |
| 2 | 0 | 0 | 1 | 0 | 1 | 0 | 0 |
| 3 | 0 | 1 | 1 | 0 | 1 | 1 | 1 |
| 4 | 0 | 1 | 0 | 0 | 0 | 0 | 1 |
| 5 | 1 | 1 | 0 | 1 | 0 | 1 | 1 |
| 6 | 1 | 1 | 1 | 1 | 1 | 0 | 1 |
| 7 | 1 | 0 | 1 | 1 | 1 | 1 | 0 |
| 8 | 1 | 0 | 0 | 1 | 0 | 0 | 0 |

FIGURE 6

| Track Number | Gray Code Pattern | | | | Encoded Address Pattern | | | | |
|---|---|---|---|---|---|---|---|---|---|
| | $b_1$ | $b_2$ | $b_3$ | $b_4$ | $b_2$ | $b_4$ | Parity Bit (X) | $b_3$ | $b_1$ |
| 1 | 0 | 0 | 0 | 0 | 0 | 0 | 1 | 0 | 0 |
| 2 | 0 | 0 | 0 | 1 | 0 | 1 | 0 | 0 | 0 |
| 3 | 0 | 0 | 1 | 1 | 0 | 1 | 1 | 1 | 0 |
| 4 | 0 | 0 | 1 | 0 | 0 | 0 | 0 | 1 | 0 |
| 5 | 0 | 1 | 1 | 0 | 1 | 0 | 1 | 1 | 0 |
| 6 | 0 | 1 | 1 | 1 | 1 | 1 | 0 | 1 | 0 |
| 7 | 0 | 1 | 0 | 1 | 1 | 1 | 1 | 0 | 0 |
| 8 | 0 | 1 | 0 | 0 | 1 | 0 | 0 | 0 | 0 |
| 9 | 1 | 1 | 0 | 0 | 1 | 0 | 1 | 0 | 1 |
| 10 | 1 | 1 | 0 | 1 | 1 | 1 | 0 | 0 | 1 |
| 11 | 1 | 1 | 1 | 1 | 1 | 1 | 1 | 1 | 1 |
| 12 | 1 | 1 | 1 | 0 | 1 | 0 | 0 | 1 | 1 |
| 13 | 1 | 0 | 1 | 0 | 0 | 0 | 1 | 1 | 1 |
| 14 | 1 | 0 | 1 | 1 | 0 | 1 | 0 | 1 | 1 |
| 15 | 1 | 0 | 0 | 1 | 0 | 1 | 1 | 0 | 1 |
| 16 | 1 | 0 | 0 | 0 | 0 | 0 | 0 | 0 | 1 |

RATE N(N+1) CODE FOR EMBEDDED SERVO ADDRESS ENCODING

BACKGROUND OF THE INVENTION

The present invention relates to encoding and decoding of track address patterns in data storage systems, and more particularly, to an encoded Gray-coded track address pattern used with computer disk drive systems.

A magnetic disc, such as a hard disc apparatus or a floppy disc apparatus, is used as a data storage and retrieval medium for a computer. Data is stored in ("written to") and retrieved ("read") from the magnetic disc in a magnetic recording device using a "read/write" magnetic transducer or "head" positioned adjacent the magnetic disc as it rotates. The magnetic disc is divided into concentric tracks along radial directions across the disc. The magnetic disc is also divided into angular sectors between selected radii of the disc. The storage or retrieval region of the magnetic disc is specified by the track number (track address) and the sector number. The sectors are further divided into a servo zone which provide positioning information for the read/write magnetic head and a normal data zone where binary data is stored. The positioning information in the servo zones includes a track address for coarse positioning of the magnetic head, and a burst pattern for fine positioning of the magnetic head, or the like.

Each track, T, on the magnetic disk has a unique address or identification number which can be represented by a Gray-code binary bit sequence address pattern, $G_T$, of a certain bit length using the well known Gray-coding scheme. The address pattern $G_T$ of a track T is recoded into a longer operational binary bit sequence pattern, $E_T$, which is written as the address of that track in, for example, a servo zone of the magnetic disc. The objective of recoding the Gray-code address pattern $G_T$ into the operational code track address pattern $E_T$ is to generate an $E_T$ pattern which the magnetic recording device can detect and recognize more reliably than the $G_T$ pattern. The ratio of the bit count length of the $G_T$ pattern to the bit count length of the $E_T$ pattern is called the rate of the code. The higher the rate, the more efficient is the code.

The recording techniques described in the prior art do not achieve the maximum possible efficiency represented by an n/(n+1) rate track address code, where $n \geq 2$. In fact, the typical rate achieved in the prior art for such recordings is ½ for all values of n, because the usual method for encoding track addresses is to provide two bits therein for each Gray-code track address bit to assure a flux reversal is obtained for each Gray-ode bit in the servo zone storage of the track addresses. However, U.S. Pat. No. 5,274,510 does teach a method that converts a $G_T$ pattern of length "n" into an $E_T$ pattern of length "n+2" for a code rate of n/(n+2). Nonetheless this is still not the most efficient track address code rate possible.

SUMMARY OF THE INVENTION

The present invention provides a track address pattern embedded in a storage medium in a portion of a track therein for representing a track address identification having a binary bit length "n". The track address pattern embedded in the medium is recoded from a Gray-code representation of the track address identification and has a binary bit length of "n+1" so as to provide, among other things, a code of rate n/(n+1), where $n \geq 2$. The encoded track address pattern (or codeword) is modeled from a Gray-code wherein a plurality of bit cells corresponding to a track address of the data storage apparatus are recoded to include a parity bit selected to maintain a selected parity for the track address pattern.

Another aspect of the invention is to provide an embedded track address pattern recoded from a Gray-code representation of the track address identification to include one parity bit, X, positioned in the interior of the track address pattern and selected to maintain a selected parity for the embedded track address pattern.

The embedded track address pattern further provides that when a "1" occurs in the same bit location in two adjacent track address patterns, then the parity on "1"s up until the same bit location is the same for both of the $m^{th}$ and the $(m-1)_{th}$ track address patterns and for the me and the $(m+1)^{th}$ track address patterns. Furthermore, the track address pattern provides that the bits of an $m_{th}$ track address identification differ from the bits of an $(m-1)^{th}$ track address identification in exactly two bit locations, and that the bit of an $m_{th}$ track address identification differs from the bits of an $(m+1)^{th}$ track address identification in exactly two bit cell locations. One of the bit positions in which the adjacent track address patterns differ is the parity bit position.

According to the present invention, the parity bit, X, is located at the center or bit position, counting from the left, represented by the integer equal to or otherwise next larger than, (n+1)/2 of the track address pattern, where n is the number of bits in the track address pattern. The Gray-code representation $G_T$ of a track address identification is denoted by $G_T = \{b_1 b_2 b_3 \ldots b_n\}$, and the corresponding embedded track address pattern $G_T$ for said track address identification is denoted by $E_T = \{\ldots b_{n-5} b_{n-3} b_{n-1} X b_n b_{n-2} b_{n-4} \ldots \}$, where X is the parity bit. Another encoding technique according to the present invention is determined by reversing the position of the least significant bit and the second least significant bit when constructing the $E_T$ codewords. This encoding technique also maintains the parity requirements between adjacent track address patterns and is expressed by $E_T = \{\ldots b_{n-4} b_{n-2} b_n X b_{n-1} b_{n-3} b_{n-5} \ldots \}$, where X is the parity bit.

BRIEF DESCRIPTION OF THE DRAWINGS

FIG. 1 is a table showing a 3-bit Gray-code pattern for a set of eight tracks as known in the prior art.

FIG. 2 is a table showing the magnetization orientations produced by the 3-bit Gray-code pattern of FIG. 1 as known in the prior art.

FIG. 3 is a table showing the voltage signals produced during the read back operation by the 3-bit Gray-code pattern of FIG. 2 as known in the prior art.

FIG. 4 is a table showing an encoding scheme for 3-bit Gray-coded track identifications according to the present invention.

FIGS. 5–7 are tables showing encoding schemes for 3 and 4 bit Gray-coded track identifications according to the present invention.

DETAILED DESCRIPTION OF THE PREFERRED EMBODIMENTS

Traditional Gray Scale Track Address Encoding Constraints

A Gray-code is often used to represent the track address identification number on a magnetic disc, because only one bit is different in adjacent code representations for adjacent tracks in Gray-coding which improves the efficiency and complexity in making track address identification determinations. More particularly, a Gray-code is used to encode track numbers into binary bit sequence address patterns (or codewords) such that the address of the $m_{th}$ track in this coding differs from the Gray-code address of the preceding or $(m-1)^{th}$ track in exactly one bit location in the code words representing each, "m" representing an arbitrarily selected track number. The address of the $m_{th}$ track also differs from the address of the next or $(m+1)^{th}$ track in exactly one bit location. FIG. 1 illustrates an example of such use of Gray-coding in which a set of eight different track numbers are each assigned a 3-bit long Gray-code address. As can be seen, the encoded binary bit sequence address pattern of the third track (011), for example, differs from the encoded binary address pattern for the adjacent second track (001), in exactly one bit position—the second bit. Similarly, the encoded binary address pattern of the third track (011) differs from the encoded binary address pattern of the adjacent fourth track (010) in exactly one bit position—the third bit.

The recoded binary bit sequence address patterns (codewords) stored in the magnetic disc media produces a pattern of localized magnetization regions or domains, one for each bit, each of which is called a bit cell. More particularly, a binary bit of value "1" of a bit sequence address pattern is represented by a direction of magnetization in the bit cell therefor which is opposite the direction of magnetization occurring in the previous bit cell on the track. A binary bit of value "0" of a bit sequence address pattern is represented by a direction of magnetization in the bit cell therefor which is the same as the direction of magnetization occurring in the previous bit cell on the track. The magnetization patterns that are produced on the magnetic medium by the track addresses in FIG. 1 are shown in FIG. 2, for which it is assumed that the bit cells are encountered from left to right and that the existing magnetization orientation in the bit cell representing the bit to the left of the left most bits in the table is from left-to-right.

During bit sequence pattern retrieval operations, a magnetic flux direction transition between adjacent magnetization regions, or bit cells, induces, or changes a circuit parameter to provide in the magnetic recording device read head circuitry, an electrical voltage pulse in the output signal waveform from that read head. In this arrangement, each such voltage pulse due to a magnetization flux direction reversal between adjacent bit cells represents a binary digit "1" as a bit of the track address pattern. The polarity of any such voltage pulse produced is always opposite the polarity of the previously produced pulse due to these flux reversal representations. The absence of such a voltage pulse in the output signal obtained from adjacent bit cells represents a binary digit "0".

More particularly, the value of the head output signal voltage waveform obtained from a bit cell is determined using a threshold detector. A "1" is determined to have occurred if the voltage in the output signal equals or exceeds a predetermined threshold value, and a "0" is determined to have occurred if the output signal voltage is less than that predetermined threshold. A bit in a bit sequence address pattern having a value of "1" produces a pulse in the head output signal waveform having an amplitude of, for example, value A. Although a bit in a bit sequence pattern having a value of "0" should ideally not produce any voltage in the corresponding head output signal waveform, spurious electrical noise does often produce a voltage having some amplitude x, which is typically a fraction of the amplitude A of an output signal waveform pulse due to retrieving a "1".

FIG. 3 illustrates the electrical signals that should be produced during an address bit sequence pattern retrieval or the read operation for the Gray-code track address bit sequence patterns shown in FIG. 1. Again, this assumes the head encounters the bit cells for the bits shown from left to right, and the bit cell preceding the bit cell representing the left most bit was magnetized so its flux was directed from left to right. An arrow in FIG. 3 denotes a voltage pulse, and the direction of the arrow indicates whether the pulse is positive or negative. An upward facing arrow indicates a positive pulse, and a downward facing arrow indicates a negative pulse.

When a head is to seek a particular track on the magnetic disc, that head is directed to scan inwardly or outwardly across the disc. As the head moves from track $T_n$ to an adjacent track $T_{n+1}$, the head is progressively subject to more flux from the bit cells of the latter track and less flux from the bit cells of the former track so that the head read output signal is due more to bits stored in the latter track than the former track. The amplitudes of the pulses produced in the head read output signal due to each bit cell in track $T_n$ having bits cells $b_{n1}$, $b_{n2}$, and $b_{n3}$ are denoted as $p_{n(b1)}$, $p_{n(b2)}$, and $p_{n(b3)}$, respectively. The amplitude of the pulse produced in each bit cell on the track $T_{n+1}$ having bit cells $b_{(n+1)1}$, $b_{(n+1)2}$, and $b_{(n+1)3}$ are denoted as $p_{(n+1)(b1)}$, $p_{(n+1)(b2)}$, and $p_{(n+1)(b3)}$, respectively. Thus, when the head is positioned between bit cells of two adjacent tracks $T_n$ and $T_{n+1}$, the amplitude of the pulse, p, seen by the threshold detector is a combination of the amplitude of the individual bit cells $p_{n(bx)}$ and $p_{(n+1)(bx)}$ of the respective tracks. When the head is positioned midway between adjacent tracks $T_n$ and $T_{n+1}$, (each track having Gray-code track address bit sequence patterns), the amplitude of the head read output signal presented to the threshold detector of the pulse, $p_{bx}$, resulting from the fluxes of each of the adjacent bit cells "$b_x$" from the two tracks is given by:

$$p_{bx}=0.5p_{n(bx)}+0.5p_{(n+1)(bx)} \qquad \text{Equation 1.}$$

One of the problems which may arise if Gray-code track address bit sequence patterns are written directly on the disc as the operational code address patterns is illustrated using FIGS. 2 and 3. When the head is located midway between tracks $T_2$ and $T_3$, the amplitudes of the read back voltage signals produced at the threshold detector's input for each adjacent bit cell pair from these tracks for the three successive bit cell positions in each track is determined using Equation 1, wherein:

$$p_{b1}=0.5p_{(2)(b1)}+0.5p_{(3)(b1)}=0.5(0)+0.5(0)=0$$

$$p_{b2}=0.5p_{(2)(b2)}+0.5p_{(3)(b2)}=0.5(0)+0.5(A)=0.5A$$

$$p_{b3}=0.5p_{(2)(b3)}+0.5p_{(3)(b3)}=0.5(A)+0.5(-A)=0$$

If the predetermined threshold value is set at 0.5A, then the threshold detector detects the pattern to be "010" indicating to the magnetic recoding device that the head is positioned on track $T_4$. However, this is incorrect as the head is in fact positioned between tracks $T_2$ and $T_3$.

When the head is positioned midway between two adjacent tracks, $T_n$ and $T_{n+1}$, if the threshold detector correctly detects all the bits in which the addresses of the tracks agree, then the detector's decision about the head position will be either track $T_n$ or $T_{n+1}$ depending on whether a "1" or a "0" is detected in the only bit cell in which the two track address patterns differ. With particular regard to the above example where the head is between tracks $T_2$ and $T_3$, although the third bit is the same in the track address patterns for both tracks, it was wrongly decided by the threshold detector resulting in erroneous information about the head position. The error occurred because the number of "1's" from left to right until, but excluding, bit cell $b_3$ in the Gray-code track address pattern for track $T_2$ is an even number, whereas the number of "1's" from left to right until, but excluding, bit cell $b_3$ in the Gray-code track address pattern for track $T_3$ is an odd number. If the number of "1's" in a track address pattern is even, the track address pattern is said have even parity. If the number of "1's" in a track address pattern is odd, the track address pattern is said to have odd parity. The difference in parity between the track address patterns of tracks $T_2$ and $T_3$, for example, resulted in voltage pulses of opposite polarity in bit cell $b_3$ for the two tracts. This difference in polarity in turn forced the threshold detector to detect a "0" when the head is positioned midway between the tracks instead of a "1". With reference to FIG. 3, a similar problem may occur if the head is midway between tracks $T_4$ and $T_5$ or midway between tracks $T_6$ and $T_7$.

A New Gray-code Track Address Constraint

The present invention particularly recognizes that all codewords (encoded Gray-code track addresses) must have the same parity. Even more, the present invention establishes a new constraint in that: when a "1" occurs at the same bit position in neighboring codewords, parity until that bit position must be the same in both codewords. With Gray code track addresses subject to this additional constraint to form operational code track addresses, and in the absence of noise, the threshold detector will always correctly detect all of the bits in the operational code track address pattern when the head is positioned midway between two adjacent tracks. In order to achieve this level of efficiency, the operational code track address pattern according to the present invention has an overhead cost of just one bit per each track address pattern so that the rate of the encoding is n/(n+1). The additional bit is referred to as a "don't care" bit, because the threshold detector's decision on this bit is ignored in determining the track address. The "don't care" bit is also interchangeably referred to as a "parity bit", X, because it ensures that the parity on "1's" in all encoded address patterns is the same, whether it is odd or even.

The Encoding Algorithm

An n-bit long Gray-code bit sequence pattern, $G_T$, for each track T on the magnetic disc medium is denoted:

$$G_T = \{b_1, b_2, \ldots b_n\} \qquad \text{Equation 2.}$$

According to the present invention and in satisfaction of the new constraint on Gray-code track addresses, an operational encoded address pattern, $E_T$, for each track is determined based on recoding the underlying Gray-code using the following encoding algorithm:

$$E_T = \{\ldots, b_{n-5}, b_{n-3}, b_{n-1}, X, b_n, b_{n-2}, b_{n-4}, \ldots\} \qquad \text{Equation 3,}$$

where X is the parity bit. A decision is made a priori whether $E_T$ should have even or odd parity and the choice determines the value of X for each track. In other words, if it is decided that the parity will be odd, then the parity bit X is predetermined to be either a "1" or a "0" for each track address to ensure that each track address has odd parity. If it is decided that the parity will be even, then the parity bit X is predetermined to be either a "1" or a "0" for each track address to ensure that each track address has even parity. The location of the parity bit is always at the bit position, counting from the left, represented by the integer equal to or otherwise next larger than, (n+1)/2, where "n" is the number of bits in the track address pattern. This bit position is the center bit position of the track address pattern. In addition, the rules regarding Gray-code track address patterns are now modified in forming the new operational code such that: neighboring codewords must differ in exactly two bit positions, and one of the bit positions in which the neighboring codewords differ is the parity bit position.

After the parity bit is determined for each track address pattern, the operational encoded track address pattern $E_T$ is constructed by starting with just the parity bit X. The length of the encoded track address pattern $E_T$ is then increased using the following two steps: First, starting from $b_n$, every other bit in $G_T$ is placed to the right of X. Second, starting from $b_{n-1}$, every other bit is placed to the left of X.

FIG. 4 illustrates the encoded track address pattern $E_T$ for the 3-bit Gray-code track address patterns of FIG. 1 where $G_T = \{b_1, b_2, b_3\}$. Using Equation 3, the encoded track address pattern $G_T$ is expressed:

$$E_T = \{b_2, X, b_3, b_1\}.$$

FIG. 5 illustrates the encoded track address pattern $E_T$ for all 4-bit Gray-code track address patterns where $G_t = \{b_1, b_2, b_3, b_4\}$. Using Equation 3, the operational encoded track address pattern $E_T$ is given by:

$$E_T = \{b_1, b_3, X, b_4, b_2\})$$

Proof That The Encoded Patterns Satisfy The New Parity Constraint

While FIGS. 4 and 5 illustrate the operational encoded track address pattern $E_T$ for all underlying 3-bit and 4-bit Gray-code track address patterns, the new "parity" constraint also applies to an encoded track address pattern of any length n. A proof is now made by mathematical induction that any Gray-code pattern encoded using Equation 3, satisfies the new "parity" constraint for any n-bit long Gray-code patterns.

Let any n-bit long Gray-code pattern $G_T$ for a track an the magnetic disc media be defined as in Equation 2 above. Using Equation 3 above, the encoded Gray-code track address pattern for odd values of "n" is as follows:

$$G_T = \{b_2, b_4, b_6, \ldots, b_{n-1}, X, b_n, b_{n-2}, \ldots, b_1\} \qquad \text{Equation 4.}$$

If the encoding method works for n-bit long Gray-code patterns, then it works for (n+1)-bit long Gray-code patterns because "n" is arbitrary. The list of Gray-code patterns of length "n" is denoted by "A", and the list of Gray-code patterns of length (n+1) is denoted by "C". The list "C" is formed using the following procedure:

1. List all the members of "A". The set "A" contains $L=2^n$ members.

$$A = \{A_1, A_2, A_3, \ldots A_L\}$$

2. Below "A", form a list "B" that contains the members of "A" in the reverse order.

$$B = (A_L, A_{L-1}, A_{L-2}, \ldots A_1)$$

3. Put a "0" before every member of "A".
4. Put a "1" before every member of "B".

Now, let "D" denote the list of encoded address patterns for "A" such that every member of list "D" has odd parity. Let "E" denote the list of encoded address patterns for list "B", such that every member of list "E" has even parity. Now, construct a list "F" as follows:

1. List all the members of list "D".

D={D₁, D₂, D₃, ... D_L}

2. Below list "D", list all the members of list "E".

E={E₁, E₂, E₃, ... E_L}

3. Put a "0" before every member of list "D". Rename this list "G".
4. Put a "1" before every member of list "E". Rename this list "H".

Then, the list "F" consists of the lists "G" and "H" with list "H" written below list "G". From list "F", it is apparent that all of the members of list "G" have odd parity on "1"s and that all of the members of list "H" also have odd parity. Therefore, every member of "F" has an odd parity on "1's". The lists "G" and "H" also satisfy the "parity" constraint mentioned above wherein: if a "1" occurs in the same bit cell location in the encoded address patterns (codewords) of two adjacent tracks, then the parity on "1's" until that location is the same in both the encoded address patterns (codewords). The members of list "F" also satisfy the "parity" constraint. However, since the lists "G" and "H" individually satisfy the constraint, it is only necessary to verify that the constraint is satisfied at the boundary of "G" and "H".

For any value of "n", the first Gray-code pattern is {000 ... 0}, and the last Gray-code pattern is {100 ... 0}. Using Equation 3 the following situation occurs in "F" at the boundary of "G" and "H".

Last member in G: 0 000 ... (0) 000 ... 1
First member in H: 1 000 ... (1) 000 ... 1
Last member in H: 1 000 ... (0) 000 ... 0
First member in G: 0 000 ... (1) 000 ... 0

The bit in the parentheses ( ) denotes the parity bit, X. Thus, it is clear members at the boundary of lists "G" and "H" satisfy the "parity" constraint, and thus all the members of list "F" satisfy the "parity" constraint. Finally, to conclude the proof for odd values of "n", it is easily verified that the list formed by applying the encoding algorithm on the list "C" is list "F".

Now, for even values of "n", Equation 3 above produces the following encoded Gray-code track address patterns:

$$E=\{b_1, b_3, b_5, \ldots, b_{n-1}, X, b_n, b_{n-2}, \ldots, b_2\} \quad \text{Equation 5.}$$

As above, if the encoding method works for n-bit long Gray-code patterns, then it works for (n+1)-bit Gray-ode patterns. The list of Gray-code patterns of length "n" are again denoted by "A", and the list of Gray-code patterns of length (n+1) are again denoted by "C".

The list "C" is formed using a similar procedure as above, but is repeated in its entirely for completeness as follows:

1. List all the members of "A". The set "A" will contain $L=2^n$ members.

A={A₁, A₂, A₃, ... A_L}

2. Below "A", form a list "B" that contains the members of "A" in the reverse order.

B={A_L, A_{L-1}, A_{L-2}, ... A₁}

3. Put a "0" before every member of "A".
4. Put a "1" before every member of "B".

Now, let "D" denote the list of encoded address patterns for "A" such that every member of list "D" has odd parity.

Let "E" denote the list of encoded address patterns for list "B" such that every member of list "E" has even parity. Now, construct a list "F" as follows:

1. List all the members of D.

D={D₁, D₂, D₃, ... D_L}

2. Below D, list all the members of E.

E={E₁, E₂, E₃, ... E_L}

3. Put a "0" after every member of D. Rename this list G.
4. Put a "1" after every member of E. Rename this list H.

Then, the list "F" again consists of the lists "G" and "H" with list "H" written below list "G". From list "F", it is apparent that all of the members of list "G" have odd parity on "1"s and that all of the members of list "H" also have odd parity. Therefore, every member of "F" has an odd parity on "1's". The lists "G" and "H" also satisfy the "parity" constraint mentioned above wherein: if a "1" occurs in the same bit cell location in the address patterns of two adjacent tracks, then the parity on "1's" until that location is the same in both the address patterns. The members of list "F" also satisfy the "parity" constraint. However, since the lists "G" and "H" individually satisfy the constraint, it is only necessary to verify that the constraint is satisfied at the boundary of "G" and "H".

As above, for any value of "n", the first Gray-code pattern is {000 ... 0}, and the last Gray-code pattern is {100 ... 0}. However, using Equation 4 the following situation occurs in "F" at the boundary of "G" and "H".

Last member in G: 1 000 ... (0) 000 ... 0
First member in H: 1 000 ... (1) 000 ... 1
Last member in H: 0 000 ... (0) 000 ... 1
First member in G: 0 000 ... (1) 000 ... 0

Again, the bit in the parentheses ( ) denotes the parity bit, X. Thus, it is clear members at the boundary of lists "G" and "H" satisfy the "parity" constraint, and thus all the members of list "F" satisfy the "parity" constraint. Finally, to conclude the proof for even values of "n", it is easily verified that the list formed by applying the encoder algorithm on the list "C" is the list "F".

Another New Encoding Algorithm

According to the present invention and in satisfaction of the new Gray-code constraint, an operational encoded address pattern, $E_T$, for each track is determined using the following the same basic encoding algorithm as in Equation 3, except that the positioning of the least significant bit (LSB) and the most significant bit (MSB) are reversed as are the bit positions of the bits selected based thereon. This new encoding algorithm is expressed as follows:

$$E_T=\{\ldots b_{n-4}, b_{n-2}, b_n, X, b_{n-1}, b_{n-3}, b_{n-5}, \ldots\}, \quad \text{Equation 6}$$

where X is the parity bit. Again, a decision is made a priori whether $E_T$ should have even or odd parity and the choice determines the value of X for each track. In other words, if it is decided that the parity will be odd, then the parity bit X is predetermined to be either a "1" or a "0" for each track address to ensure that each track address has odd parity. If it is decided that the parity will be even, then the parity bit X is predetermined to be either a "1" or a "0" for each track address to ensure that each track address has even parity. The location of the parity bit is again always at bit position, counting from the right, represented by the integer equal to or otherwise next larger than, (n+1)/2, where "n" is the number of bits in the track address pattern. As with Equation 3, the rules regarding Gray-code track address patterns are now modified in forming the new operational code such that: neighboring codewords must differ in exactly two bit positions, and one of the bit positions in which the neighboring codewords differ should be the parity bit position.

After the parity bit is determined for each track address pattern, the operational encoded track address pattern $E_T$ is constructed by starting with just the parity bit X. The length of the encoded track address pattern $E_T$ is then increased using the following two steps: First, starting from $b_n$, every other bit in $G_T$ is placed to the left of X. Second, starting from $b_{n-1}$, every other bit is placed to the right of X.

FIG. 6 illustrates the encoded track address pattern $E_T$ for the 3-bit Gray-code track address patterns of Figure where $G_T=\{b_1, b_2, b_3\}$. Using Equation 5, the encoded track address pattern $E_T$ is expressed:

$$E_T=\{b_1, b_3, X, b_2\}$$

FIG. 7 illustrates the encoded track address pattern $E_T$ for all 4-bit Gray-code track address patterns where $G_t=\{b_1, b_2, b_3, b_4\}$. Using Equation 5, the operational encoded track address pattern $E_T$ is given by:

$$E_T=\{b_2, b_4, X, b_3, b_1\}.$$

While FIGS. 6 and 7 illustrate the operational encoded track address pattern $E_T$ for all 3-bit and 4-bit Gray-coded track address patterns, the new "parity" constraint also applies to an encoded track address pattern of any length n. The proof of this proposition is not included herein, but rather maybe determined using mathematical induction approach similar to that preformed above for equation 3.

Track Address Pattern Decoding

At the time of reading back the operational code bit sequence address pattern, the decision made by the threshold detector in the parity bit position is ignored. Rather, the decision of the threshold detector is considered only in the remaining bit cells. With such an approach, it is observed that whenever the head is positioned between two adjacent tracks $T_1$ and $T_2$, in the absence of noise, the detector indicates that the head is on either $T_1$ or $T_2$, but not elsewhere.

The encoding and decoding circuitry for useably implementing the encoding and decoding algorithm is easily constructed using binary and logic circuit principles well known to those skilled in the art for some time and is not provided herein.

Although the present invention has been described with reference to preferred embodiments, workers skilled in the art will recognize that changes may be made in form and detail without departing from the spirit and scope of the invention.

What is claimed is:

1. A track address pattern embedded in a storage medium in a portion of a track therein for representing a track address identification on the medium, the embedded track address pattern being recoded from a Gray-code representation of the track address identification to include one parity bit, X, positioned in the interior of the track address pattern and selected to maintain a selected parity for the embedded track address patterns of adjacent tracks, the parity bit position within the track address pattern being the same for all tracks in the storage medium.

2. The track address pattern of claim 1, wherein the track address pattern of an $m_{th}$ track address identification differs from the track address pattern of an $(m-1)_{th}$ track address identification in exactly two bit locations, and wherein the track address pattern of the $m_{th}$ track address identification differs from the track address pattern of an $(m+1)_{th}$ track address identification in exactly two bit locations.

3. The track address pattern of claim 1, wherein the parity bit, X, is positioned at the center of the encoded track address.

4. The track address pattern of claim 3, wherein bits of the Gray code representation are rearranged around the parity bit to form the track address pattern.

5. The track address pattern of claim 4, wherein bits of the Gray code representation are arranged in an alternating manner such that even numbered bits of the Gray code representation are arranged on one side of the parity bit and odd numbered bits of the Gray code representation are arranged on an opposite side of the parity bit.

6. The track address pattern of claim 1, wherein the Gray-code representation $G_T$ of a track address identification is denoted by $G_T=\{b_1 b_2 b_3 \ldots b_n\}$, and wherein the corresponding track address pattern $E_T$ for said track is denoted by $E_T=\{ \ldots b_{n-5} b_{n-3} b_{n-1} X b_n b_{n-2} b_{n-4} \ldots \}$, where X is the parity bit.

7. The track address pattern of claim 1, wherein a Gray-code representation $G_T$ of a track address identification is denoted by $G_T=\{b_1 b_2 b_3 \ldots b_n\}$, and wherein the corresponding track address pattern $E_T$ for said track is denoted by $E_T=\{ \ldots b_{n-4} b_{n-2} b_n X b_{n-1} b_{n-3} b_{n-5} \ldots \}$, where X is the parity bit.

8. A track address pattern embedded in a storage medium in a portion of a track therein for representing a track address identification on the medium, the track address pattern embedded in the medium being recoded from a Gray-code representation of the track address identification, the track address pattern comprising the following constraints:

i) binary bits of a track address pattern defining an $m_{th}$ track address identification differ from binary bits defining an $(m-1)_{th}$ track address identification in exactly two binary bit locations, one of the locations being a parity location;

ii) binary bits of a track address pattern defining the $m_{th}$ track address identification differ from binary bit defining an $(m+1)_{th}$ track address identification in exactly two binary bit locations, one of the locations being a parity location; and ii) the parity location being at the same position in the track address pattern of each track in the storage medium.

9. The track address pattern of claim 8, further comprising a constraint wherein: when a "1" occurs in the same bit location in two adjacent track address patterns, then the parity up until said same bit location is the same for both the $m_{th}$ and the $(m-1)_{th}$ track address patterns and for the $m_{th}$ and the $(m+1)_{th}$ track address patterns.

10. The track address pattern of claim 9, wherein the parity bit, X, is positioned in the center of the track address pattern.

11. The track address pattern of claim 10, wherein bits of the Gray code representation are rearranged around the parity bit to form the track address pattern.

12. The track address pattern of claim 11, wherein bits of the Gray code representation are rearranged in an alternating manner such that even numbered bits of the Gray code representation are arranged on one side of the parity bit and such that odd numbered bits of the gray code representation are arranged on an opposite side of the parity bit.

13. The track address pattern of claim 9, wherein the Gray-code representation $G_T$ of a track address identification is denoted by $G_T=\{b_1b_2b_3 \ldots b_n\}$, and wherein the corresponding track address pattern $E_T$ for said track is denoted by $E_T=\{ \ldots b_{n-5}b_{n-3}b_{n-1}Xb_nb_{n-2}b_{n-4} \ldots \}$, where X is the parity bit.

14. The track address pattern of claim 9, wherein a Gray-code representation $G_T$ of a track address identification is denoted by $G_T=\{b_1b_2b_3 \ldots b_n\}$, and wherein the corresponding track address pattern $E_T$ for said track is denoted by $E_T=\{ \ldots b_{n-4}b_{n-2}b_nXb_{n-1}b_{n-3}b_{n-5} \ldots \}$, where X is the parity bit.

15. A track address pattern embedded in a storage medium in a portion of a track therein for representing a track address identification on the medium, the embedded track address pattern being recoded from a Gray-code representation of the track address identification to include one parity bit, X, positioned in the interior of the track address pattern and selected to maintain a selected parity for the embedded track address patterns of adjacent tracks, the Gray code representation being arranged in the track address pattern in an alternating manner such that even numbered bits of the Gray code representation are arranged on one side of the parity bit and odd numbered bits of the Gray code representation are arranged on an opposite side of the parity bit.

16. The track address pattern of claim 15, wherein the track address pattern of an $m_{th}$ track address identification differs from the track address pattern of an $(m-1)_{th}$ track address identification in exactly two bit locations, and wherein the track address pattern of the $m_{th}$ track address identification differs from the track address pattern of an $(m+1)_{th}$ track address identification in exactly two bit locations.

17. The track address pattern of claim 15, further comprising a constraint wherein: when a "1" occurs in the same bit location in two adjacent track address patterns, then the parity up until said same bit location is the same for both the $m_{th}$ and the $(m-1)_{th}$ track address patterns and for the $m_{th}$ and the $(m+1)_{th}$ track address patterns.

18. The track address pattern of claim 15, wherein the Gray-code representation $G_T$ of a track address identification is denoted by $G_T=\{b_1b_2b_3 \ldots b_n\}$, and wherein the corresponding track address pattern $E_T$ for said track is denoted by $E_T=\{ \ldots b_{n-5}b_{n-3}b_{n-1}Xb_nb_{n-2}b_{n-4} \ldots \}$, where X is the parity bit.

19. The track address pattern of claim 15, wherein a Gray-code representation $G_T$ of a track address identification is denoted by $G_T=\{b_1b_2b_3 \ldots b_n\}$, and wherein the corresponding track address pattern $G_T$ for said track is denoted by $E_T=\{ \ldots b_{n-4}b_{n-2}b_nXb_{n-1}b_{n-3}b_{n-5} \ldots \}$, where X is the parity bit.

20. The track address pattern of claim 15, wherein the track address pattern satisfies the following constraints:

i) all track address patterns have the same parity;

ii) adjacent track address patterns differ from each other in exactly two bit positions;

iii) one of the positions in which the adjacent track address patterns differ from each other is the parity bit position; and iv) when a "1" occurs at the same bit position in adjacent track address patterns, parity until that position is the same in both track address patterns.

\* \* \* \* \*

UNITED STATES PATENT AND TRADEMARK OFFICE
CERTIFICATE OF CORRECTION

PATENT NO. : 5,949,358　　　　　　　　PART 1 OF 3

DATED : SEPTEMBER 7, 1999

INVENTOR(S) : LEROY ALLEN VOLZ ET AL.

It is certified that error appears in the above-identified patent and that said Letters Patent is hereby corrected as shown below:

Cover Page, Abstract, line 6, delete "n$\geq$2.", insert --n$\geq$2.--

Col. 1, line 50, delete "ode", insert --code--

Col. 2, line 13, delete "(m-1)$_{th}$", insert --(m-1)$^{th}$--

Col. 2, line 13, delete "me", insert --m$^{th}$--

Col. 2, line 15, delete "m$_{th}$", insert --m$^{th}$--

Col. 2, line 18, delete "m$_{th}$", insert --m$^{th}$--

Col. 2, line 29, delete "G$_t$", insert --E$_t$--

Col. 3, line 3, delete "m$_{th}$", insert --m$^{th}$--

Col. 3, line 7, delete "m$_{th}$", insert --m$^{th}$--

Col. 6, line 18, delete "G$_t$", insert --E$_t$--

Col. 6, line 43, delete "G$_t$", insert --E$_t$--

Col. 7, line 45, delete "E=", insert --E$_t$ =--

Col. 7, line 48, delete "ode", insert --code--

Col. 10, line 2, delete "m$_{th}$", insert --m$^{th}$--

Col. 10, line 3, delete "(m-1)$_{th}$", insert --(m-1)$^{th}$--

UNITED STATES PATENT AND TRADEMARK OFFICE
CERTIFICATE OF CORRECTION

PATENT NO. : 5,949,358

DATED : SEPTEMBER 7, 1999

INVENTOR(S) : LEROY ALLEN VOLZ ET AL.

It is certified that error appears in the above-identified patent and that said Letters Patent is hereby corrected as shown below:

Col. 10, line 5, delete "$m_{th}$", insert --$m^{th}$--

Col. 10, line 6, delete "$(m+1)_{th}$", insert --$(m+1)^{th}$--

Col. 10, line 37, delete "$m_{th}$", insert --$m^{th}$--

Col. 10, line 39, delete "$(m-1)_{th}$", insert --$(m-1)^{th}$--

Col. 10, line 42, delete "$m_{th}$", insert --$m^{th}$--

Col. 10, line 44, delete "$(m+1)_{th}$", insert --$(m+1)^{th}$--

Col. 10, line 54, delete "$m_{th}$", insert --$m^{th}$-- both occurrences

Col. 10, line 54, delete "$(m-1)_{th}$", insert --$(m-1)^{th}$--

Col. 10, line 55, delete "$(m+1)_{th}$,", insert --$(m+1)^{th}$--

Col. 11, line 27, delete "$m_{th}$", insert --$m^{th}$--

Col. 11, line 28, delete "$(m-1)_{th}$", insert --$(m-1)^{th}$--

Col. 11, line 30, delete "$m_{th}$", insert --$m^{th}$--

Col. 11, line 32, delete "$(m+1)_{th}$", insert --$(m+1)^{th}$--

Col. 12, line 5, delete "$m_{th}$", insert --$m^{th}$--both occurrences

UNITED STATES PATENT AND TRADEMARK OFFICE
CERTIFICATE OF CORRECTION

PATENT NO. : 5,949,358  PART 3 OF 3
DATED : SEPTEMBER 7, 1999
INVENTOR(S) : LEROY ALLEN VOLZ ET AL.

It is certified that error appears in the above-identified patent and that said Letters Patent is hereby corrected as shown below:

Col. 12, line 5, delete "$(m-1)_{th}$", insert --$(m-1)^{th}$--.

Col. 12, line 6, delete "$(m+1)_{th}$", insert --$(m+1)^{th}$--

Col. 12, line 16, delete "$G_t$", insert --$E_t$--

Signed and Sealed this

Twentieth Day of June, 2000

Q. TODD DICKINSON

Attest:

*Attesting Officer*          *Director of Patents and Trademarks*